United States Patent [19]
Ling et al.

[11] Patent Number: 6,153,455
[45] Date of Patent: Nov. 28, 2000

[54] METHOD OF FABRICATING ULTRA SHALLOW JUNCTION CMOS TRANSISTORS WITH NITRIDE DISPOSABLE SPACER

[75] Inventors: Zicheng Gary Ling, Sunnyvale; James Chiang, Mountain View, both of Calif.

[73] Assignee: Advanced Micro Devices, Sunnyvale, Calif.

[21] Appl. No.: 09/170,619

[22] Filed: Oct. 13, 1998

[51] Int. Cl.⁷ .................. H01L 21/334; H01L 21/335; H01L 21/336; H01L 21/8232; H01L 21/8238

[52] U.S. Cl. ................ 438/231; 438/197; 438/199; 438/227; 438/229; 438/230; 438/231; 438/303; 438/305; 438/306; 438/307; 257/369; 257/408

[58] Field of Search ................... 438/231, 305, 438/424, 302, 228, 220, 297, 286, 227, 535, 303, 306, 307; 257/369

[56] References Cited

U.S. PATENT DOCUMENTS

| | | | |
|---|---|---|---|
| 4,745,086 | 5/1988 | Parrillo et al. | 438/231 |
| 4,978,626 | 12/1990 | Poon et al. | 438/220 |
| 4,994,404 | 2/1991 | Sheng et al. | 438/297 |
| 5,069,747 | 12/1991 | Cathey et al. | 156/643 |
| 5,286,664 | 2/1994 | Horiuchi . | |
| 5,405,791 | 4/1995 | Ahmad et al. | 438/228 |
| 5,536,684 | 7/1996 | Dass et al. | 438/535 |
| 5,580,804 | 12/1996 | Joh . | |
| 5,610,088 | 3/1997 | Chang et al. | 438/231 |
| 5,654,213 | 8/1997 | Choi et al. | 438/227 |
| 5,693,974 | 12/1997 | Hsu et al. | 257/369 |
| 5,780,350 | 7/1998 | Kapoor | 438/305 |
| 5,783,458 | 7/1998 | Kadosh et al. . | |
| 5,786,257 | 7/1998 | Wen . | |
| 5,824,588 | 10/1998 | Liu | 438/302 |
| 5,847,428 | 12/1998 | Fulford, Jr. et al. | 257/344 |
| 5,880,006 | 3/1999 | Lin et al. | 438/424 |
| 5,904,529 | 5/1999 | Gardner et al. | 438/286 |
| 5,970,353 | 10/1999 | Sultan | 438/302 |

FOREIGN PATENT DOCUMENTS

| | | | |
|---|---|---|---|
| 86109816 | 7/1986 | European Pat. Off. | H01L 21/28 |
| 4-0624443 | 2/1993 | Japan | H01L 29/788 |

OTHER PUBLICATIONS

*Silicon Processing for the VLSI Era—vol. III*, "Shallow Trench and Refill Isolation" (date unknown), pp. 367–373.

*Primary Examiner*—Tom Thomas
*Assistant Examiner*—Bernard E. Souw
*Attorney, Agent, or Firm*—Brinks Hofer Gilson & Lione

[57] ABSTRACT

A method of developing a transistor, such as a complimentary MOS (CMOS) transistor, that includes lightly doped drain (LDD) regions which uses disposable spacers, and includes the step of adding an oxide spacer etch after a disposable nitride spacer removal and between source/drain implant and LDD implant. Because of this additional step, an ultra shallow LDD implant can be achieved. Moreover, uniformity of the depth of the junction is improved as the non-uniformity of the screen/liner oxide is eliminated.

18 Claims, 5 Drawing Sheets

METHOD OF FABRICATING ULTRA SHALLOW JUNCTION CMOS TRANSISTORS WITH NITRIDE DISPOSABLE SPACER

FIELD OF THE INVENTION

The present invention is directed to the fabrication of transistors, such as Complementary Metal Oxide Silicon (CMOS) transistors, having lightly doped drain (LDD) regions and, more particularly, to such transistors which include an oxide spacer etch after a disposable nitride spacer removal so that ultra shallow LDD junctions may be achieved.

BACKGROUND OF THE INVENTION

A field-effect transistor is a semiconductor device which depends on the control of current by an electric field for its operation. There are two types of field-effect transistors: the junction field-effect transistor (JFET or FET) and the metal-oxide-semiconductor field-effect transistor (MOSFET).

Field-effect transistors may be N-channel or P-channel type. Current is caused to flow along the length of a semiconductor bar of the N-type or P-type material when a voltage supply is connected between the two ends of a channel of the bar. The current is comprised of majority carriers, which are typically electrons. The source is the terminal through which the majority carriers enter the bar, while the drain is the terminal through which the majority carriers exit the bar. On both sides of the bar, heavily doped regions of acceptor impurities are formed by, for example, alloying or diffusion. These regions are called gates. Between a gate and the source, a voltage is applied to reverse-bias the P-N junction. The region of the bar between the two gate regions is the channel. The majority carriers move through the channel from the source to the drain.

In a JFET, an electric field is applied to the channel through a P-N diode. In a MOSFET, a metal gate electrode is utilized, which is separated from the semiconductor channel by an oxide layer. In this manner, the metal-oxide-semiconductor allows an electric field to effect the channel if an external potential is applied between the gate and the substrate.

There are two types of MOSFET transistors: a depletion MOSFET and an enhancement MOSFET. For the depletion MOSFET, at zero gate voltage and a fixed drain voltage, the current is at a maximum and then decreased with applied gate potential. For the enhancement MOSFET, there is no current at zero gate voltage and the output current increases with an increase in gate potential.

Additionally, a complementary MOS (CMOS) device is a device which has both P-channel and N-channel enhancement on the same chip.

In the construction of MOSFET devices, lightly doped drain (LDD) regions have commonly been used to reduce the hot electron effect in a FET. This is made possible by providing LDD regions in the substrate which separate the more heavily doped source and drain regions from the channel region of the substrate, thereby reducing the electric field at the source and drain pinch-off regions, and thus increasing the channel breakdown voltage and reducing electron impact ionization (hot electron effects). LDD regions are typically formed on both sides of the channel, since either one of the source/drain regions are capable of functioning as a drain region, depending upon how the device is later electrically connected to the remainder of the integrated circuit structure.

A FET having LDD regions is typically fabricated in an active region of a substrate. The active region has a P-type background doping and is bounded by field oxide (FOX) regions which electrically isolate the FET from other devices formed in the same substrate. To form a FET with a LDD region, a disposable spacer approach may be used. A spacer material layer is formed over the entire structure and etched so that spacers remain at the ends of the gate. These spacers overlie portions of the active regions adjacent to the gate structures. Thereafter, a first implant is performed with a heavy dose of a P-type or N-type dopant to form $P^+$ source and drain regions or $N^+$ source and drain regions, respectively. During this implant, the spacers mask the underlying active regions. The underlying active regions which do not receive the second implant become the LDD regions. Thus, the width of the spacers define the width of the LDD regions. Then, after the disposable spacers have been removed, a second implant is performed with a lighter dose of a P-type or N-type dopant to form $P^-$ LDD regions or $N^-$ LDD regions, respectively.

One manner of forming spacers is to perform a dry etch of a spacer layer, typically a silicon nitride ($Si_3N_4$) layer. In particular, after the deposition of an etch stop layer, typically an oxide layer, the spacer layer is deposited over the substrate, the gate, and the field oxide regions, and is subsequently etched isotropically to provide the spacers. An etchant is selected which isotropically etches the spacer layer and will stop etching on the etch stop layer. The etchant that removes the spacers will also stop on the etch stop layer due to the etch selectivity difference.

Typical masking steps include a $N^+$ mask to form $N^+$ source and drain regions, $P^+$ mask to form $P^+$ source and drain regions, a $N^-$ mask to form lightly doped $N^-$ regions and a $P^-$ mask to form lightly doped $P^-$ regions. A mask is a transparent support material coated with a thin layer of opaque material. Certain portions of the mask are moved, leaving opaque material on the mask in the precise pattern required on the silicon surface. More particularly, the openings of the mask correspond to the areas where it is desired to remove the silicon dioxide from the silicon surface. Each masking step typically includes the sequential steps of preparing the substrate, applying the photoresist material, soft-baking, aligning and isotropically exposing the photoresist to radiation by using a mask, baking, hard baking, developing the patterns in the resist, hard baking, implanting a desired dose of a dopant with the required conductivity type, stripping the photoresist, and then cleaning the substrate.

Previously, LDD implant could be achieved to a depth on the order of 300 Angstroms to 700 Angstroms. Moreover, the depth of the LDD junction varied due to the non-uniformity of the layer of liner oxide. Accordingly, there is a need for an ultra shallow LDD implant which improves the uniformity of the junction depth as the non-uniformity of the liner oxide layer is eliminated.

SUMMARY OF THE INVENTION

One aspect of the invention provides a method of fabricating a transistor having a lightly doped drain region. The first step is to form a gate having side edges in an active region of a substrate, where the gate overlies a portion of the active region. The next step is to form an oxide layer over the gate. Then, a nitride layer is formed over the oxide layer. The next step is to isotropically etch the nitride layer to form sidewall spacers about the side edges of the gate. Then, heavily doped source and drain regions are implanted into the substrate and about the side edges of the gate using the nitride sidewall spacers. The nitride sidewall spacers are then removed. The oxide layer is then isotropically etched to form thin oxide spacers. Then, lightly doped drain regions are implanted between the side edges of the gates and the heavily doped drain regions. The oxide layer is preferably etched using an isotropic dry etch so that the edge of the gate oxide will not be attacked. The chemistry of the gas used in this dry etch is, preferably, $CF_4$:$CHF_3$:Ar. Because of the oxide spacer etch step, the lightly doped drain region is implanted to an ultra shallow level of depth, to the range of about 150 Angstroms to about 300 angstroms. Moreover, uniformity of the depth of the junction is improved as the non-uniformity of the oxide etch stop layer is eliminated.

Another aspect of the present invention provides a method of fabricating a complementary MOS transistor having a lightly doped drain region. The first steps are to form a first gate, which has side edges, in a first active region of a substrate and to form a second gate, which also has side edges, in a second active region of the substrate. An oxide layer is then formed over the substrate including the first and second gates. A spacer material layer is then formed over the oxide layer and the substrate, including the first and second gates. Preferably, the spacer material layer is composed of nitride. The nitride layer is then isotropically etched with respect to the oxide layer to form nitride sidewall spacers about the side edges of the first and second gates. Heavily doped source and drain regions of the first and the second conductivity type are then implanted sequentially into the substrate using two different masks and using the nitride sidewall spacer masks. The nitride sidewall spacers are then removed along the side edges of the gates. The oxide layer is then isotropically etched to form thin oxide spacers along the side edges of the gates. Lightly doped drain regions of the first and the second conductivity type are then implanted sequentially along the side edges of the gates between the gates the heavily doped drain regions using two different masks. The oxide layer is preferably etched using an isotropic dry etch so that the edge of the gate oxide will not be attacked. The chemistry of the gas used in this dry etch is, preferably, $CF_4$:$CHF_3$:Ar. The oxide spacer is preferably thin in width, in the range of about 60 Angstroms to about 100 Angstroms. Because of the oxide spacer etch step, lightly doped drain regions are implanted to an ultra shallow level of depth, to the range of about 150 Angstroms to about 300 Angstroms. Moreover, uniformity of the depth of the junction is improved as the non-uniformity of the oxide etch stop layer is eliminated.

These and other objects, advantages, and features of the present invention will be better understood upon review of the following detailed description of the preferred embodiments.

BRIEF DESCRIPTION OF THE DRAWINGS

FIG. 1 is a schematic, cross-sectional illustration showing a formed CMOS transistor of the present invention;

DETAILED DESCRIPTION OF THE PREFERRED EMBODIMENTS

Figure 1:
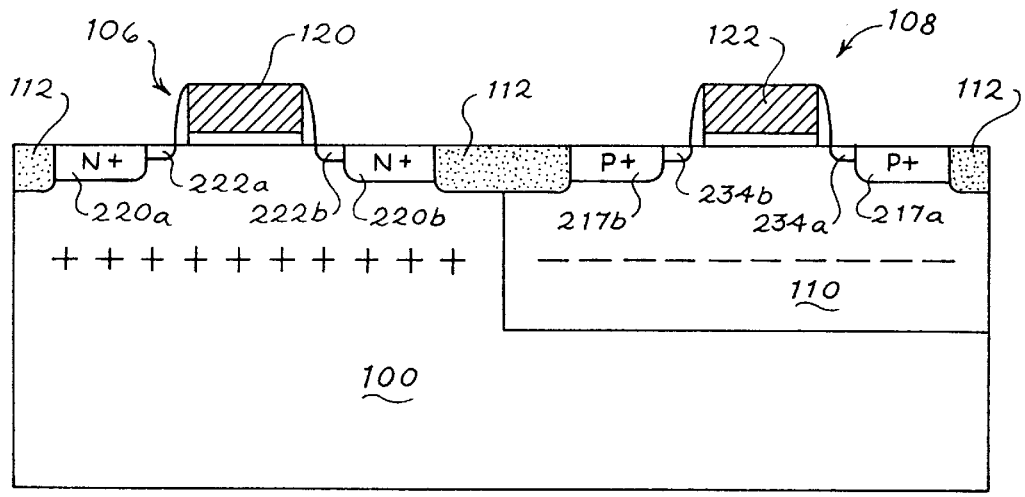
FIG. 1 illustrates a CMOS transistor formed by the steps illustrated in FIGS. 2 through 10.

FIG. 1 illustrates a CMOS transistor 10 formed using the steps of the present invention. In particular, the CMOS transistor 10 is shown with one N-channel transistor 106 and one P-channel transistor 108 formed thereon. For convenience, the CMOS transistor 10 is shown with one N-channel transistor and one P-channel transistor. Additional N-channel and P-channel transistors may be part of the CMOS transistor without departing from the spirit and scope of the present invention. In particular, the CMOS transistor 10 includes a first active region comprised of P substrate 100 and a second active region comprised of N-well region 110. The P substrate 100 and the N-well region 110 are separated by field oxide regions 112. The P-channel resistor 108 is shown in N-well region 110, while the N-channel resistor 106 is shown in P substrate 100. The P-channel resistor 108 includes gate structure 122, while the N-channel resistor 106 includes gate structure 120.

In the steps described below, highly doped source and drain regions and lightly doped source and drain regions are formed on the CMOS transistor 10. As shown in FIG. 1, the highly doped drain and source regions of the P-channel transistor 108 are 217a and 217b, respectively, while the highly doped drain and source regions of the N-channel transistor 106 are 220a and 220b, respectively. Similarly, the lightly doped drain and source regions of the P-channel resistor 108 are 234a and 234b, respectively, while the lightly doped drain and source regions of the N-channel resistor 106 are 222a and 222b, respectively.

Figure 2:
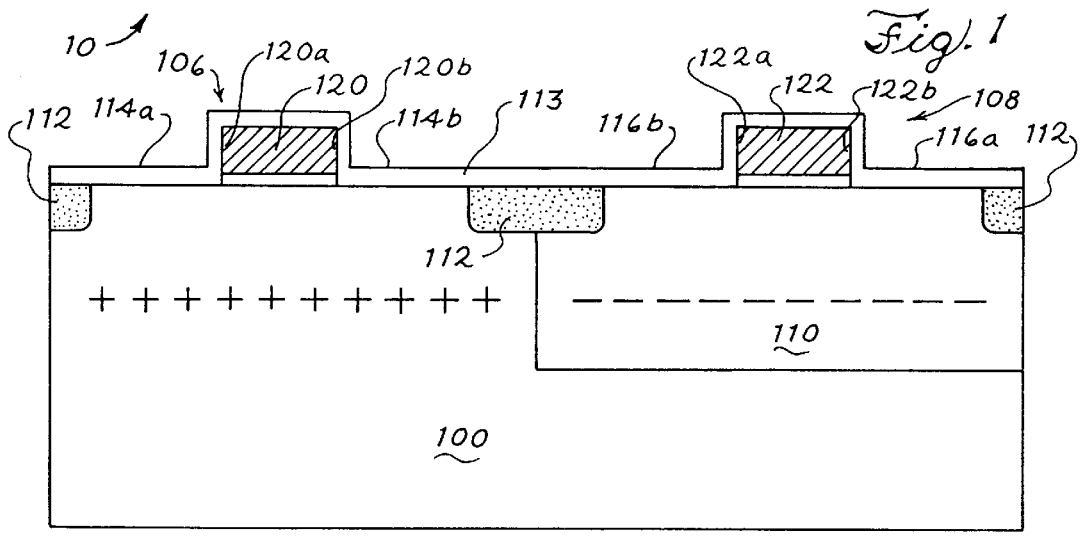
FIG. 2 is a schematic, cross-sectional illustration showing the partially formed CMOS transistor of the present invention after an oxide layer has been deposited thereon.

FIGS. 2 through 10 illustrate in detail a LDD process for fabricating CMOS transistors in accordance with the present invention. FIG. 2 illustrates a partially formed CMOS transistor 10 after it has been provided with active regions defined by field oxide regions. The P substrate 100 is, such as, for example, a silicon wafer. The partially formed transistors 106, 108 may be implemented using P-well, N-well or twin-tub technologies. The starting material is the substrate 100. Typically, the substrate 100 is lightly doped or heavily doped with a lightly doped epitaxial layer at the surface. The partially formed P-channel transistor 108 is fabricated in an N-well region 110 which is formed in a typical manner using N-well or twin-tub technologies as a somewhat heavily doped N-well structure. The N-well region 110 used in the P-well technology is a lightly doped N-substrate. Similarly, the partially formed N-channel transistor 106 is fabricated in a P-doped substrate region (which is part of P substrate 100). The P-doped substrate is typically formed as either lightly doped P-substrate or a more heavily doped P-well region.

In a preferred embodiment, the CMOS transistor 10 has a shallow trench and refill isolation structure. In particular, thermal oxide layer is grown on the substrate 100, followed by a chemical vapor deposition (CVD) nitride film deposition. Relatively shallow trenches 112 are then etched into the substrate 100 (typically on the order of 0.3 to 0.5 micrometers deep) using an active mask. The shallow trenches 112 may be etched with a dry etch so that the trench sidewalls have an incline of about 70 to about 85 degrees. Then, a short thermal oxidation growth on the trench sidewalls is performed to control the interface quality between the silicon and the oxide. Next, CVD oxide is deposited to fill the trenches. The oxide layer is polished back and stopped on the CVD nitride layer, to leave the oxide only in the recesses of the trenches. Then, the nitride is removed by a wet etch using phosphoric etchant. Field oxide regions such as regions 112 are formed with a liner oxidation followed by field oxide deposition. These regions isolate active device regions 114a, 114b, 116a and 116b. The well areas 100, 110 are formed by using a well mask which exposes all of the well areas and implanting well ions into these areas.

In another embodiment (not shown), the well regions are formed by growing a thermal oxide layer on the substrate, depositing a CVD nitride film, applying a mask which generally protects the silicon surface but exposes the well areas, and implanting ions into the well areas. Well ions are driven into the silicon by high temperature cycling. A threshold voltage ($V_T$) threshold-adjust implant is applied. The surface of the substrate is stripped of the oxide and nitride/oxide layers and a new pad-oxide/nitride layer for forming isolation structures is formed. A mask is applied to pattern the pad-oxide/nitride layer to define active device regions including the N-doped substrate region and the P-doped substrate region and to define field regions. Field oxide is then grown to form field oxide regions to isolate active device regions. The field oxide electrically isolates the transistors from each other, and from other devices in the substrate. The nitride/oxide layer is then removed from the active device regions.

In either of the above embodiments, after the well regions and the active regions are defined, an oxide layer is thermally grown overlying the surface of the substrate 100 to form gate oxide. In particular, the oxide layer is provided on the first active regions 114a, 114b, second active regions 116a, 116b and also over the field oxide regions 112. Active regions 114a, 114b and gate 120 will respectively form the drain, source and gate regions of the N-channel transistor 106. Similarly, active regions 116a, 116b and gate 122 will respectively form the source, drain and gate regions of the P-channel transistor 108. Subsequently, a polysilicon gate layer is then deposited by CVD and a mask is applied to pattern the polysilicon into first and second gate structures 120 and 122, respectively. Polysilicon gate 120 of the N-channel transistor 106 is formed overlying a region of P-doped substrate region, while polysilicon gate 122 of the P-channel transistor 108 is formed overlying a region of N-well region 110. Gate structures 120 and 122, respectively, have side edges 120a, 120b and 122a, 122b.

Thus, the transistors 106 and 108 shown in FIG. 2 are prior to source, drain and LDD ion implantation. The dopant types discussed are used for the purpose of illustration. Furthermore, the method of the present invention applies to the fabrication of both enhancement mode and depletion mode devices.

As shown in FIG. 2, after the gates 120 and 122 are formed, a layer of undoped oxide (UDOX) 113 is deposited over the surface of the CMOS transistor 10, including over the gate structures 120 and 122. A suitable thickness of the UDOX layer 113 ranges from approximately 100 to approximately 200 Angstroms (Å). The UDOX layer 113 is utilized as an etch stop layer.

Figure 3:
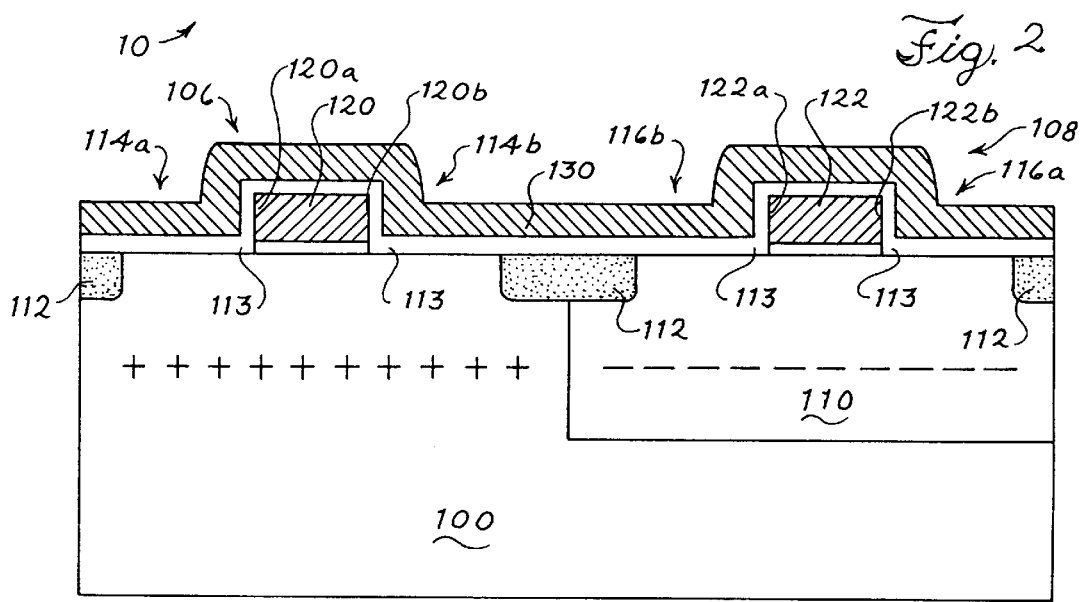
FIG. 3 is a schematic, cross-sectional illustration showing the CMOS transistor after a nitride layer has been deposited thereon.

Next, as shown in FIG. 3, a spacer layer 130 (which ranges from approximately 500 Angstroms to approximately 1500 Angstroms) is deposited over the UDOX layer 113. The spacer layer 130 may be a silicon nitride ($Si_3N_4$) layer formed using conventional techniques.

Figure 4:
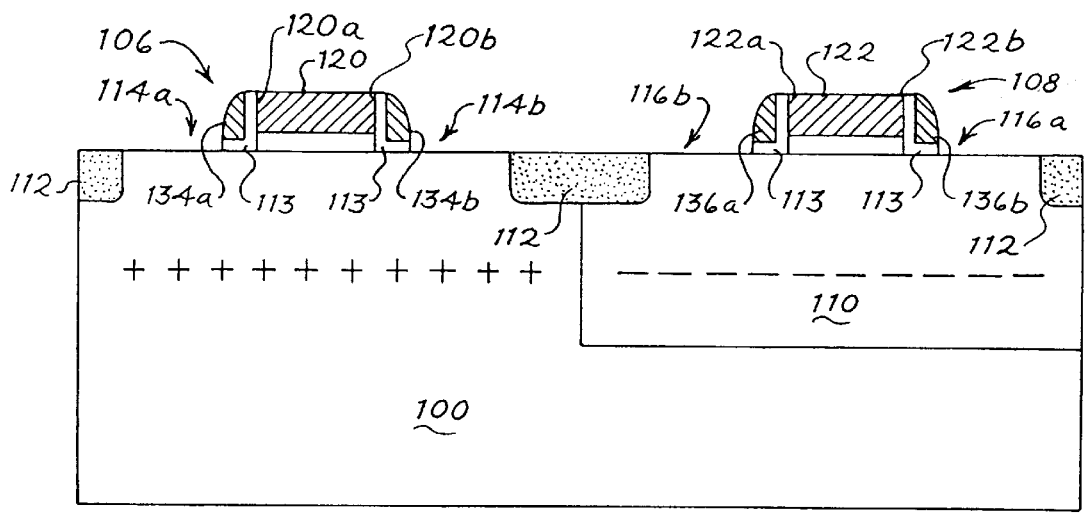
FIG. 4 is a schematic, cross-sectional illustration showing the CMOS transistor after the nitride layer has been isotropically etched to form nitride spacers.

Then, as shown in FIG. 4, an etchant isotropically etches the nitride layer 130 until only disposable nitride sidewall spacers 134a and 134b, and 136a and 136b, remain at the side, edges 120a, 120b and 122a, 122b of gates 120 and 122, respectively. The etch is isotropic in nature, which means that in a given direction, the same amount of nitride layer will be removed during the etch process. The UDOX layer 113 is the etch stop layer for the nitride spacer etch. The UDOX layer 113 protects the silicon substrate to be etched during the nitride spacer etch.

The next steps include implanting heavily doped source and drain regions of a first and a second conductivity type around the gates, while utilizing first and second masks. In particular, heavily doped source and drain regions of one conductivity type are formed around one gate while masking off the other gate, and then heavily doped source and drain regions of the other conductivity type are formed around the other gate, while masking the first gate. Additionally, the nitride spacers 134a, 134b and 136a, 136b are used as additional masks around the gates 120, 122, respectively, for the later creation of the LDD regions.

Figure 5:
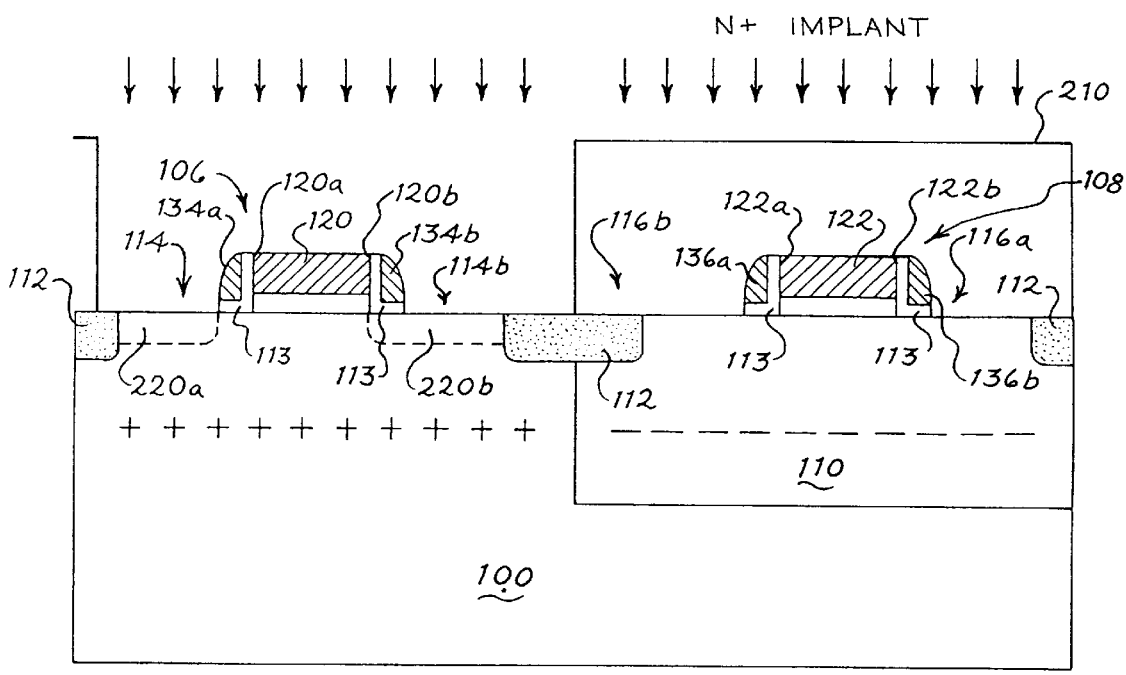
FIGS. 5 and 6 are schematic, cross-sectional illustrations showing the CMOS transistor during the implantation of heavily doped source and drain regions of two conductivity types, namely, $N^+$ and $P^+$.

As shown in FIG. 5, the first masking step is masking gate 122 and the first ion implant step is around gate 120. In particular, a layer of photoresist material 210 forms a barrier over, or masks, the N well region 110, which includes gate structure 122 and active regions 116a and 116b. Then, a $N^+$ implant is used to form the $N^+$ source region 220b and $N^+$ drain region 220a of N-channel resistor 106, which are self-aligned with the gate 120. Spacers 134a and 134b serve as masks to prevent ion implantation in the portions of active regions 114a and 114b underlying spacers 134a and 134b. Typical $N^+$ implants are performed with, for example, $As^+$ ions at 20 to 80 Kev with an implant dosage of, for example, $3\times10^{15}$ atoms per $cm^2$.

Figure 6:
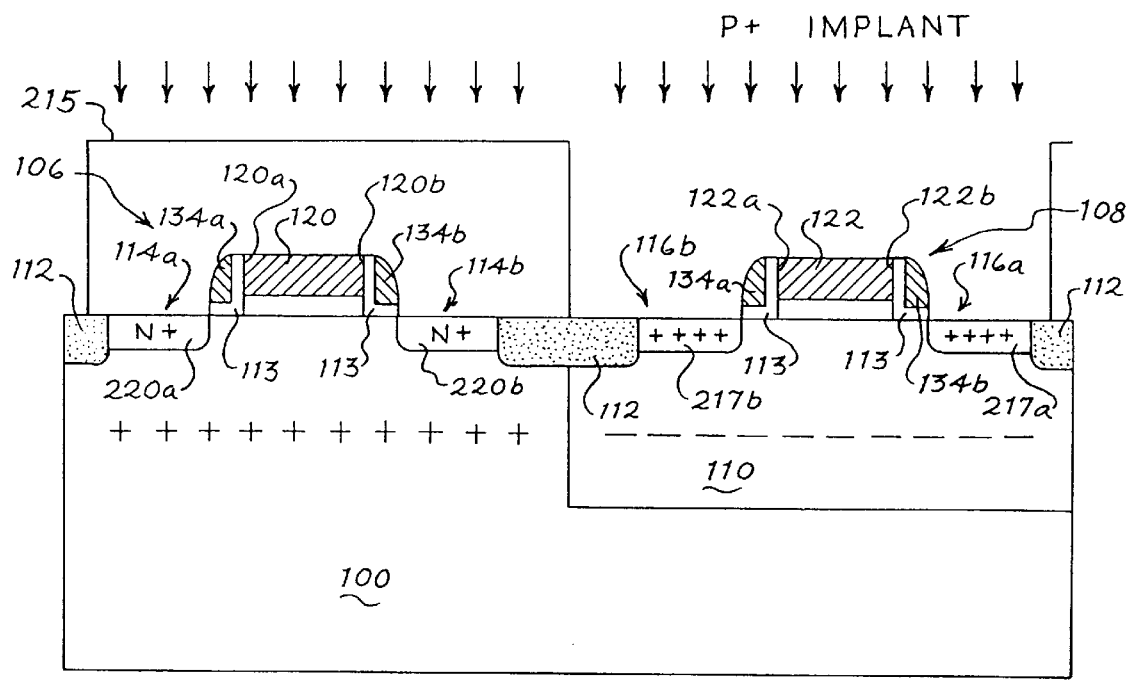

Then, as shown in FIG. 6, the second masking step is masking gate 120 and the second ion implant step is around gate 122. In particular, a layer of photoresist material 215 forms a barrier over the P substrate 100 where the gate 120 and the active regions 114a and 114b are located. Then, a $P^+$ implant is used to form the $P^+$ source region 217b and the $P^+$ drain region 217a of P-channel resistor 108, which are self-aligned with gate 122. Spacers 136a and 136b serve as masks to prevent ion implantation in the portions of active regions 116a and 116b underlying spacers 136a and 136b. Typical $P^+$ implant is performed with, for example, $BF^{2+}$ ions at 40 to 60 Kev with an implant dosage of, for example, $2\times10^{15}$ atoms per $cm^2$.

Figure 7:
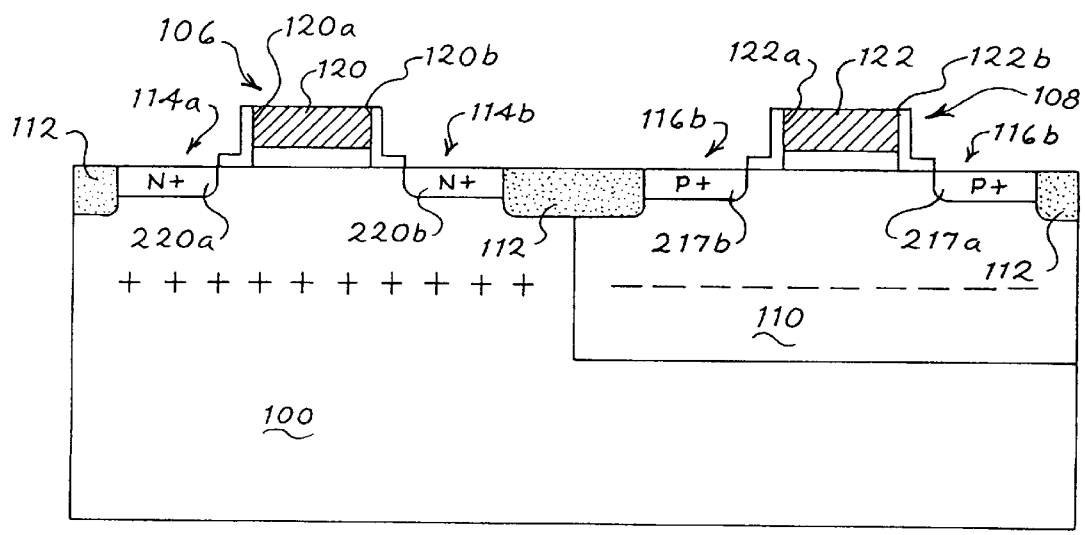
FIG. 7 is a schematic, cross-sectional illustration showing the CMOS transistor after the nitride spacers have been removed.

Next, as shown in FIG. 7, the nitride spacers 134a, 134b, 136a and 136b, as they are disposable, are removed by a wet etch. Preferably, the nitride spacers 134a, 134b, 136a and 136b are removed using a wet phosphoric etcher strip. In particular, wet phosphoric acid is utilized at a high temperature to remove the nitride spacers 134a, 134b, 136a and 136b without effecting the UDOX layer 113 between the nitride spacers and the gates 120, 122.

Figure 8:
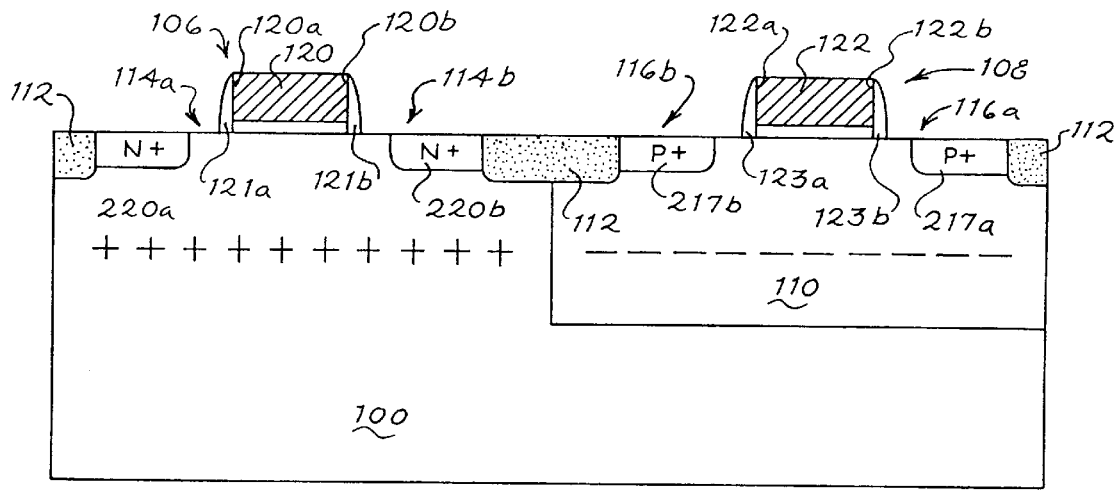
FIG. 8 is a schematic, cross-sectional illustration showing the CMOS transistor after the oxide layer has been isotropically etched to form oxide spacers.

Then, as shown in FIG. 8, an etchant which isotropically etches the UDOX layer 113 is used to etch the UDOX layer 113 to allow the next step of LDD implant to be achieved at an ultra shallow level. The UDOX layer 113 is etched to form oxide spacers 121*a*, 121*b* on the sides of gate 120 and oxide spacers 123*a*, 123*b* on the sides of gate 122. An isotropic dry etching process is typically used to form the spacers since a preferable spacer form is achieved in this manner. Again, an isotropic etch means that the same amount of material is removed in a given direction. Preferably, the dry etch uses a gas such as, for example, Tetrafluoromethane ($CF_4$), Trifluoromethane ($CHF_3$) and Argon (Ar). Typically, the oxide spacers 121*a*, 121*b* and 123*a*, 123*b* are thin in width, in the range of about 60 Angstroms to about 100 Angstroms.

The next steps include implanting lightly doped source and drain regions of a first and a second conductivity type around the gates, while utilizing third and fourth masks. In particular, lightly doped source and drain regions of one conductivity type are formed around one gate while masking off the other gate, and then lightly doped source and drain regions of the other conductivity type are formed around the other gate, while masking the first gate.

Figure 9:
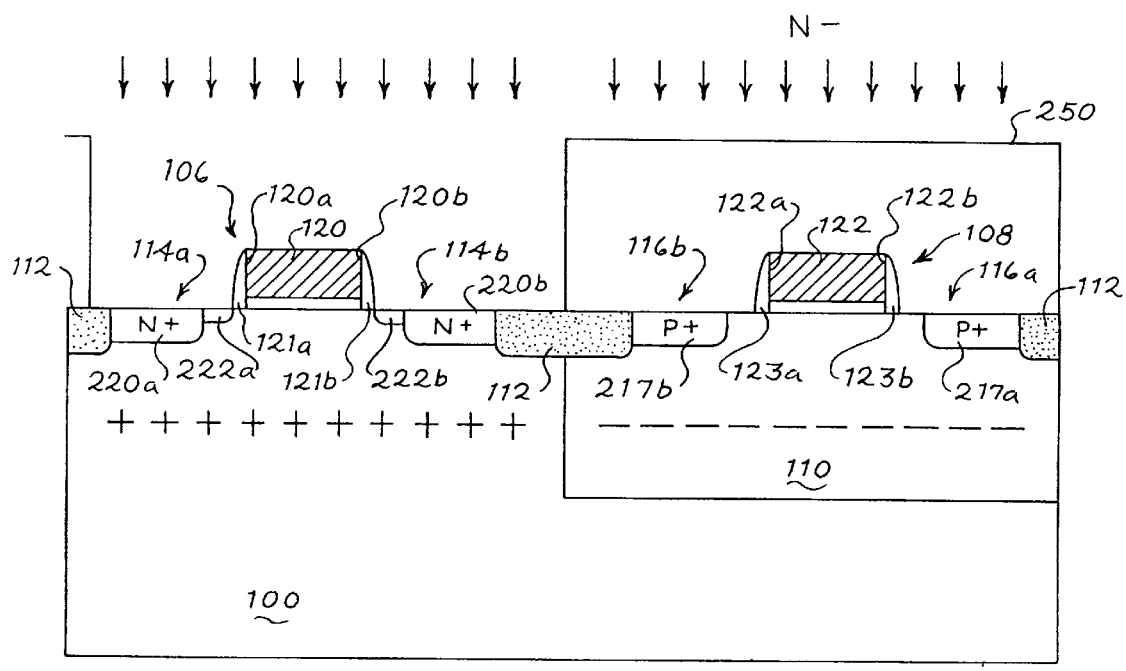
FIGS. 9 and 10 are schematic, cross-sectional illustrations showing the CMOS transistor during the implantation of lightly doped source and drain regions of two conductivity types, namely, $N^-$ and $P^-$.

In particular, as shown in FIG. 9, gate 122 is first masked by barrier layer 250, and then a third ion implant step is performed using $N^-$ implant. The $N^-$ implant is used to form N-channel transistor lightly doped drain (LDD) region 222*a* and lightly doped source (LDS) region 222*b*, which are respectively self-aligned with the side edges 120*a* and 120*b* of gate 120. An N-type dopant for use in implanting LDD region 222*a* and LDS region 222*b* may be, for example, $As^+$ ions at 3 KeV with an implant dosage of, for example, $4 \times 10^{14}$ atoms per $cm^2$.

Figure 10:
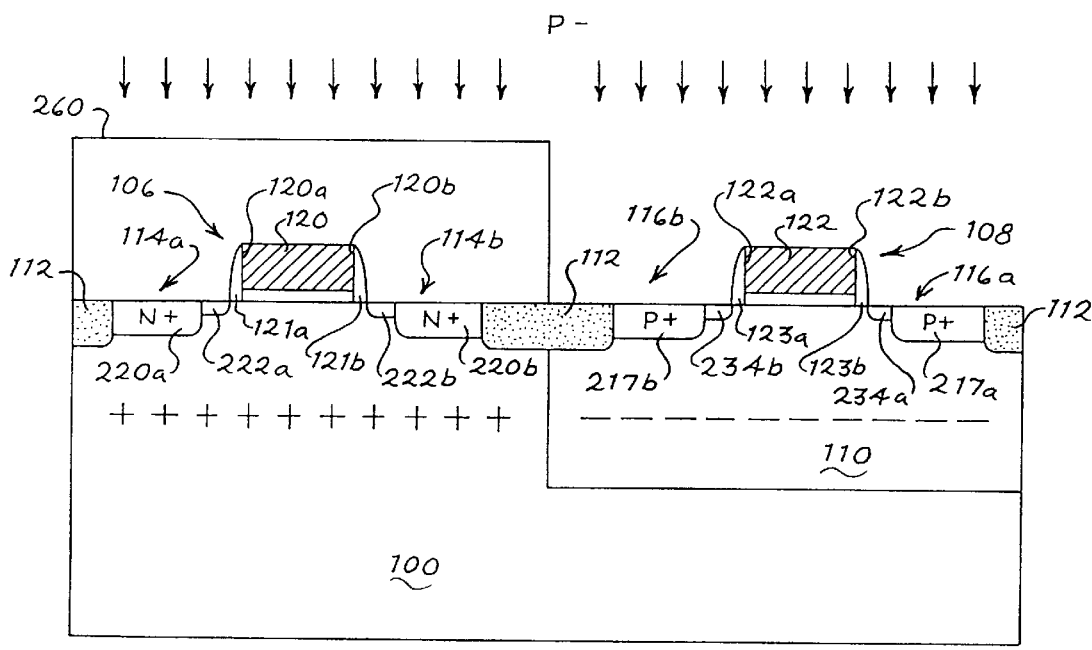

Then, as shown in FIG. 10, gate 120 is first masked by barrier layer 260, and a fourth ion implant step is performed using $P^-$ implant. The $P^-$ implant is used to form P-channel transistor LDD 234*a* and LDS 234*b* which are respectively self-aligned with the side edges 122*a* and 122*b* of gate 122. A P-type dopant for use in implanting lightly doped region 234*a* and 234*b* may be, for example, B ions at 3 KeV with an implant dosage of, for example, $4 \times 10^{14}$ atoms per $cm^2$.

Typically, lightly doped regions are formed on the order of 300 Angstroms to 700 Angstroms. By utilizing the oxide spacer etch, the implant of the lightly doped regions may be achieved to a depth on the order of about 150 Angstroms to about 300 Angstroms.

Accordingly, by using the method of the present invention for forming CMOS transistors with LDD regions, source and drain implant are done prior to LDD implant. In addition, by adding the step of an oxide spacer etch, ultra shallow LDD implant may be achieved. Accordingly, uniformity of junction depth is improved as the non-uniformity of the screen/liner oxide is eliminated. In addition, by having the oxide spacer etch, which removes the liner oxide, the LDD implant may be performed with very low energy to achieve an ultra shallow junction. Advantages of having an ultra shallow LDD junction include better control of short channel effect, and therefore, increased speed of the transistors.

Of course, it should be understood that a wide range of changes and modifications can be made to the embodiments described above. It is therefore intended that the foregoing description illustrates rather than limits this invention, and that it is the following claims, including all equivalents, which define this invention.

What is claimed is:

1. A method of fabricating a transistor having a lightly doped drain region, comprising the sequential steps of:
    (a) forming a gate having side edges in an active region of a substrate, said active region defined by field oxide regions;
    (b) forming an oxide layer over said gate;
    (c) forming a nitride layer over said oxide layer;
    (d) isotropically etching said nitride layer to form nitride sidewall spacers about said side edges of said gate;
    (e) implanting heavily doped source and drain regions in said substrate in a region adjacent to said nitride sidewall spacers;
    (f) removing said nitride sidewall spacers;
    (g) isotropically etching said oxide layer to form oxide sidewall spacers; and
    (h) implanting a lightly doped drain region in said substrate between one of said side edges of said gate and said heavily doped drain region.

2. The method of claim 1 wherein said step of implanting the lightly doped drain region further comprises implanting a lightly doped source region between another one of said side edges of said gate and said heavily doped source region.

3. The method of claim 1 wherein said heavily doped source and drain regions and said lightly doped drain region are of the same conductivity type.

4. The method of claim 1 wherein said step of isotropically etching said oxide layer is a dry etch.

5. The method of claim 4 wherein said dry etch is performed using $CF_4:CHF_3:Ar$.

6. The method of claim 1 wherein said lightly doped drain region is implanted to an ultra shallow level of depth, to the range of about 150 Angstroms to about 300 Angstroms.

7. A method of fabricating a complementary MOS transistor having a lightly doped drain and source regions, comprising the sequential steps of:
    (a) forming a first gate having side edges in a first active region of a substrate, said first active region being of a first conductivity type;
    (b) forming a second gate having side edges in a second active region of said substrate, said second active region being of a second conductivity type;
    (c) forming an oxide layer over said substrate;
    (d) forming a spacer material layer over said oxide layer and said substrate including said first and second gates, wherein said spacer material layer is composed of nitride;
    (e) isotropically etching said nitride layer with respect to said oxide layer to form nitride sidewall spacers about said side edges of said first and second gates;
    (f) implanting heavily doped source and drain regions of said first and second conductivity types sequentially into said substrate and about said side edges of said first and second gates while utilizing first and second masks and utilizing said nitride sidewall spacers as additional masks, wherein said first conductivity type is implanted about said second gate while one of said first or second masks forms a barrier over said first gate and wherein said second conductivity type is implanted about said first gate while the other of said first or second masks forms a barrier over said second gate;
    (g) removing said nitride sidewall spacers along said side edges of said gates;
    (h) isotropically etching said oxide layer to form sidewall oxide spacers; and
    (i) implanting lightly doped regions of said first and second conductivity types sequentially into said substrate between said heavily doped source and drain regions and said side edges of said first and second gates while utilizing third and fourth masks, wherein said first conductivity type is implanted about said second gate while one of said third or fourth masks forms a barrier over said first gate and wherein said second conductivity type is implanted about said first gate while the other of said third or fourth mask forms a barrier over said second gate.

8. The method of claim 7 wherein said step of isotropically etching said oxide layer is a dry etch.

9. The method of claim 8 wherein said dry etch is performed using $CF_4:CHF_3:Ar$.

10. The method of claim 7 wherein said sidewall oxide spacers are thin in width, in the range of about 60 Angstroms to about 100 Angstroms.

11. The method of claim 7 wherein said lightly doped drain regions are implanted to an ultra shallow level of depth, to the range of about 150 Angstroms to about 300 Angstroms.

12. A method of fabricating a complementary MOS transistor having a lightly doped drain region, comprising the sequential steps of:

(a) forming a first gate having side edges in a first active region of a substrate, said first active region being of a first conductivity type;

(b) forming a second gate having side edges in a second active region of said substrate, said second active region being of a second conductivity type;

(c) forming an oxide layer over said substrate;

(d) forming a spacer material layer over said oxide layer and said substrate including said first and second gates, wherein said spacer material layer is composed of nitride;

(e) isotropically etching said nitride layer with respect to said oxide layer to form nitride sidewall spacers about said side edges of said first and second gates;

(f) forming a first mask over selected areas of the substrate including said second active region and excluding said first active region;

(g) implanting heavily doped source and drain regions of said second conductivity type into said substrate and about said side edges of said first gate using said nitride sidewall spacers as additional masks while said second active region is protected by said first mask;

(h) forming a second mask over selected areas of the substrate including said first active region and excluding said second active region;

(i) implanting heavily doped source and drain regions of said first conductivity type into said substrate and about said side edges of said second gate using said nitride sidewall spacers as additional masks while said first active region is protected by said second mask;

(j) removing said nitride sidewall spacers along said side edges of said gates;

(k) isotropically etching said oxide layer to form sidewall oxide spacers;

(l) forming a third mask over selected areas of the substrate including said second active region and excluding said first active region;

(m) implanting a lightly doped drain region of said second conductivity type between one of said side edges of said first gate and said heavily doped drain region while said second active region is protected by said third mask;

(n) forming a fourth mask over selected areas of the substrate including said first active region and excluding said second active region; and (o) implanting a lightly doped drain region of said first conductivity type between one of said side edges of said second gate and said heavily doped drain region while said first active region is protected by said fourth mask.

13. The method of claim 12 wherein said step of isotropically etching said oxide layer is a dry etch.

14. The method of claim 13 wherein said dry etch is performed using $CF_4:CHF_3:Ar$.

15. The method of claim 12 wherein said sidewall oxide spacers are thin in width, in the range of about 60 Angstroms to about 100 Angstroms.

16. The method of claim 12 wherein said lightly doped drain regions of said first and second conductivity types are implanted to an ultra shallow level, to the range of about 150 Angstroms to about 300 Angstroms.

17. The method of claim 12 wherein said step of implanting said lightly doped drain region of said first conductivity type further comprises implanting a lightly doped source region between another one of said side edges of said second gate and said heavily doped source region in said second active region, and said step of implanting said lightly doped drain region of said second conductivity type further comprises implanting a lightly doped source region between another one of said side edges of said first gate and said heavily doped source region in said first active region.

18. The method of claim 17 wherein said lightly doped drain and source regions of said first and second conductivity types are implanted to an ultra shallow level, to the range of about 150 Angstroms to about 300 Angstroms.

* * * * *